United States Patent
Ohmi et al.

(10) Patent No.: US 6,416,586 B1
(45) Date of Patent: Jul. 9, 2002

(54) CLEANING METHOD

(75) Inventors: Tadahiro Ohmi, 1-17-301, Komegabukuro 2-chome, Aoba-ku, Sendai-shi, Miyagi-ken 980-0813 (JP); Toshihiro Il; Kenji Mori, both of Miyagi-ken (JP); Toshikazu Abe; Hirosi Arakawa, both of Miyagi-ken (JP); Takahisa Nitta, Tokyo (JP)

(73) Assignees: Tadahiro Ohmi, Miyagi-Ken; Kabushiki Kaisha Ultraclean Technology Reserach Institute, Tokyo, both of (JP)

( * ) Notice: Subject to any disclaimer, the term of this patent is extended or adjusted under 35 U.S.C. 154(b) by 0 days.

(21) Appl. No.: 09/450,167

(22) Filed: Nov. 29, 1999

(30) Foreign Application Priority Data

Dec. 1, 1998 (JP) .......................................... 10-378469
Aug. 31, 1999 (JP) .......................................... 11-285875

(51) Int. Cl.[7] .............................. B08B 3/08; B08B 3/10; B08B 3/12; C23G 1/02

(52) U.S. Cl. ................................ 134/1; 134/1.3; 134/2; 134/3; 134/26; 134/28; 134/30; 134/32; 134/37; 134/41; 134/902

(58) Field of Search ........................... 134/4, 1.3, 2, 3, 134/26, 28, 30, 32, 37, 41, 902

(56) References Cited

U.S. PATENT DOCUMENTS 5,712,198 A * 1/1998 Shive et al. ................. 437/235
6,035,871 A * 3/2000 Eui-Yeol ..................... 134/61

* cited by examiner

*Primary Examiner*—Zeinab El-Arini
(74) *Attorney, Agent, or Firm*—Randall J. Knuth

(57) ABSTRACT

The present invention has as an object thereof to provide a cleaning method which realizes, in the cleaning process, (1) a reduction in the number of processes, (2) a simplification of the cleaning apparatus, and (3) a reduction in the amount of chemicals and pure water employed, and which has highly superior cleaning effects and does not damage the substrate body, as well as to provide a rinsing method which aids in the hydrogen termination of silicon atoms.

17 Claims, 1 Drawing Sheet

CLEANING METHOD

BACKGROUND OF THE INVENTION AND DESCRIPTION OF RELATED ART

1. Technological Field

Figure 1:
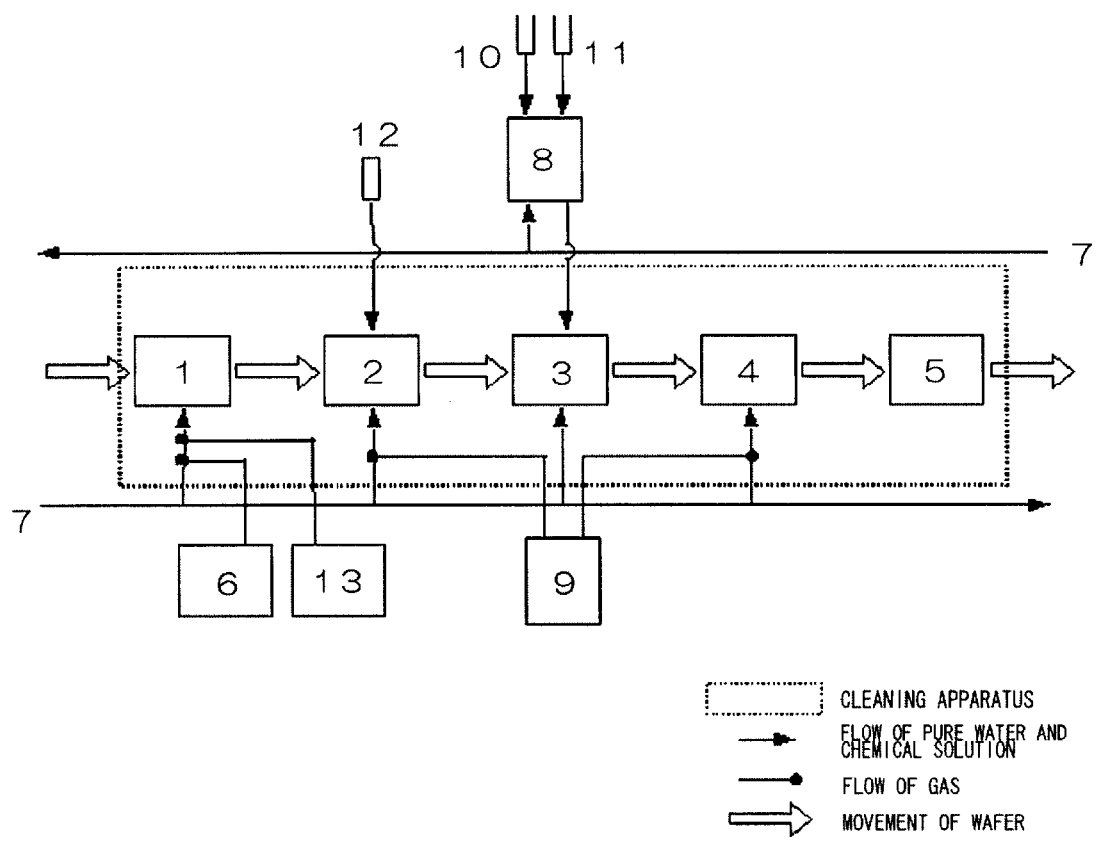

The present invention relates to a cleaning method for substrate bodies and, in particular, is preferably applied as a cleaning method for a manufacturing processes of semiconductor substrate bodies, liquid crystal substrate bodies, magnetic substrate bodies, or superconducting substrate bodies.

2. Background Art

Semiconductor elements formed on semiconductor substrates have increased in density and minuteness to the sub-quarter-micron (less than 0.25 $\mu$m) level. In order to obtain an increase in LSI density to the sub-quarter-micron level, it is necessary to maintain the surface of the semiconductor substrate in a state of complete ultra-cleanliness.

In other words, it is necessary to remove contaminants, such as organic materials, metals, oxides (oxide films), and the like from the surface of the semiconductor substrate, and the surface must have a flatness on the molecular order. For this reason, it is necessary to conduct the cleaning of the semiconductor substrate.

Hitherto, the cleaning method which has been employed as the method for cleaning the semiconductor substrates is commonly referred to as RCA cleaning. In such cleaning, an aqueous solution is employed which is prepared by combining, with ultrapure water, a substance having a strong removing effect with respect to organic materials, metals, microparticles, and oxides (oxide film), such as, for example, sulfuric acid, ammonia, hydrogen peroxide, hydrofluoric acid, or the like; this aqueous solution is employed at high temperatures or at room temperature.

However, it has been determined that it is impossible to completely remove inorganic materials using these chemical solutions, and furthermore, as a result of these chemical solutions, the semiconductor substrate is eroded and irregularities are formed, and it has been confirmed that this has an effect on the characteristics of the device, such as the mobility of the carriers, the insulating characteristics of the oxide film formed on the substrate, and the like.

For this reason, the development of a cleaning method has been desired which is capable, during the manufacture of highly functional semiconductor devices, of completely removing inorganic materials without causing damage to the semiconductor substrate.

Furthermore, in order to maintain the degree of cleanliness of the surfaces of the semiconductor substrate in the conventional cleaning method, the cleaning processes were complicated and lengthy, and moreover, large amounts of chemicals and ultrapure water were required, so that the facilities and the like were large in size, and this constituted an obstacle to reducing the cost of semiconductor devices.

Currently, in place of RCA cleaning, wet cleaning has been developed, which employs, as the cleaning water, hydrogenated water, in which hydrogen gas is added to ultrapure water, or ozonated water, in which ozone gas is added to ultrapure water. By controlling the pH and the oxidation-reduction potential (ORP) of the ultrapure water, it has been possible to realize a reduction in the number of processes and a reduction in the amount of chemicals and ultrapure water employed, while maintaining the cleaning effects achieved by the conventional cleaning method (Japanese Patent Application, First Publication, Number HEI 11-57636).

In wet cleaning, in order to obtain greater cleaning effects, the pH of the hydrogenated water or ozonated water which is used as the cleaning water is controlled using chemicals.

However, because the chemical concentration in the cleaning water is not constant as a result of the chemical injection method of the chemical supply apparatus, it is impossible to accurately control the pH of the cleaning water. Furthermore, the poor quality of the chemicals employed can lead to a reduction in the quality of the cleaning water. Thus the development of a method for the control of the pH and the cleaning water which is capable of easily and accurately controlling the pH of the cleaning water has been desired.

In particular, in the wet cleaning process of silicon substrates, after cleaning with a cleaning solution containing hydrofluoric acid, the substrate surface adopts a structure in which the outermost surface thereof is terminated with hydrogen molecules; this hydrogen-terminated surface maintains an electrical state which is almost identical to that within a bulk-form silicon crystal, while being a surface. For this reason, hydrogen-terminated surfaces are chemically stable surfaces.

However, it is not the case that all silicon molecules are bonded to hydrogen molecules; some silicon molecules appear on the surface in an unbonded state, and the presence of silicon molecules which are bonded to fluorine molecules has been confirmed. Such silicon molecules are extremely chemically unstable and represent likely oxidation sites.

OBJECT AND SUMMARY OF THE INVENTION

Object of the Invention

The present invention has as an object thereof to provide a cleaning method which realizes, in the cleaning process, (1) a reduction in the number of processes, (2) a simplification of the cleaning apparatus, and (3) a reduction in the amount of chemicals and pure water employed, and which has highly superior cleaning effects and does not damage the substrate, as well as to provide a rinsing method which aids in the hydrogen termination of silicon atoms.

The present invention provides a cleaning method which is characterized in comprising:

- a first process for removing organic materials and/or metallic impurities deposited on an object to be cleaned by means of an aqueous solution containing ozone;
- a second process for removing microparticles deposited on a substrate while applying vibration of 500 kHz or more to an aqueous solution containing hydrogen;
- a third process for removing metallic impurities and/or silicon oxide films by means of an aqueous solution containing hydrofluoric acid and hydrogen peroxide; and
- a fourth process, in which vibration of 500 kHz or more is applied to an aqueous solution containing hydrogen gas, which has as an object thereof the removal of the chemical agents of processes 1 through 3 and/or the removal and prevention of redeposition of microparticles.

The cleaning process is characterized in being carried out at room temperature. In particular, in the case of cleaning processes in the manufacturing processes of semiconductor substrates, liquid crystal substrates, magnetic substrates, and superconducting substrates, it is preferable that the temperature be greater than or equal to 20° C. and less than or equal to 30° C.

The cleaning process using an aqueous solution containing ozone employs an aqueous solution in which ozone is dissolved in pure water or ultrapure water to an ozone concentration of 2 mg/L or more, gases other than ozone are added, and the pH thereof is regulated so as to be between 4 and 5 inclusive.

The cleaning process using an aqueous solution containing hydrogen employs an aqueous solution in which hydrogen is dissolved in pure water or ultrapure water at a concentration of 1.2 mg/L or more, and the concentration of gases other than hydrogen is regulated so as to be 0.1 mg/L or less.

In the case of cleaning processes having as the chief object thereof the removal of microparticles, it is preferable that the pH of the aqueous solution containing hydrogen be 9.0 or greater.

In the cleaning process containing hydrofluoric acid and hydrogen peroxide, an aqueous solution is employed in which the concentration of hydrofluoric acid is between 0.05 wt % and 1.0 wt % inclusive, and the concentration of hydrogen peroxide is between 0.1 wt % and 1.0 wt % inclusive.

By means of the present invention, it is possible to remove impurities, such as organic materials, metal, microparticles, and the like, which are deposited on the semiconductor substrate bodies, and this does not cause surface irregularities such as very small roughnesses in the substrate body surface. The reason for this is thought to be as follows.

First, by means of employing ultrapure water to which ozone has been added in the first process, as a result of the action of the activated oxygen, organic materials deposited on the surface of the substrate are completely oxidized and removed, and simultaneously, the surface of the substrate is mildly oxidized.

The deposited metals also enter an ionized state at this time and are dissolved; however, a portion thereof are incorporated into the oxide film.

Continuing, by means of setting the pH of the solution in the second process to one which is slightly alkaline, the electrostatic force operating between the microparticles and the object to be cleaned is made negative, and as a result of ultrasonic vibration, the microparticles may be removed from the surface of the object to be cleaned.

Next, in the third process, hydrogen peroxide is added in addition to hydrofluoric acid, and it is possible to remove the oxide film with the hydrofluoric acid while oxidizing the surface with the hydrogen peroxide, so that it is easily possible to remove impurities even if the amount of impurities is great. At this point in time, the metals incorporated in the oxide film in the first process are also removed.

Finally, in the fourth process, the chief object is the rinsing of the chemical solution used in the third process; however, in the event that microparticles are deposited, the ability is provided to remove the microparticles in addition to rinsing as a result of the effects of the hydrogen and ultrasound.

Furthermore, when the surface to be cleaned is a silicon surface, by conducting the rinsing in a reducing atmosphere in which the oxidation-reduction potential is −0.4 V (vs. NHE), it is possible to promote a chemically stable hydrogen-terminated surface in which the atoms of the outermost surface are covered with hydrogen molecules.

In accordance with the present invention, the following effects are obtained.

The cleaning method is one in which it is possible to completely remove impurities on the substrate body surface, such as organic materials, metals, microparticles, and the like, without causing damage to the substrate body, and moreover, the processes are greatly simplified, so that it is possible to conduct the treatment in a shorter period of time, and it is possible to achieve more stable cleaning effects. Furthermore, as a result of a great reduction in the amount of chemicals and ultrapure water employed and a reduction in the manufacturing apparatus cost, it is possible to realize a reduction in cost of the final semiconductor, liquid crystal, magnetic, and superconducting materials and devices.

BRIEF DESCRIPTION OF THE DIAGRAMS

FIG. 1 is a schematic view showing the cleaning lines of embodiments 1 through 9 and comparative examples 2 through 5.

DESCRIPTION OF THE REFERENCES

1 first process cleaning vessel,
2 second process cleaning vessel,
3 third process cleaning vessel,
4 fourth process cleaning vessel,
5 drying treatment vessel,
6 ozone generator,
7 ultrapure water pipe,
8 chemical solution mixing vessel,
9 hydrogen gas supply apparatus,
10 hydrofluoric acid measuring vessel,
11 hydrogen peroxide measuring vessel,
12 ammonia measuring vessel,
13 carbon dioxide supply apparatus.

DETAILED DESCRIPTION OF THE PREFERRED EMBODIMENTS

Hereinbelow, the present invention will be concretely explained using embodiments; however, it is of course the case that the present invention is in no way restricted to the embodiments described.

The pure water employed in the present invention refers to water having a resistivity of 15.0 MΩ, or more, and ultrapure water refers to water having a resistivity of 18.0 MΩ or more. In particular, in the ultrapure water, it is preferable that the total amount of organic carbon be 10 μg/L or less, that the amount of metal components such as copper and iron be, respectively, 0.02 μg/L or less, and furthermore, that the number of microparticles of 0.05 μm or more be 10 per liter or less.

The gases added in order to control the pH of the aqueous solution employed in the present invention, and the method of their supply, are not particularly restricted; however, in view of the requirements for stability and ease of handling, ammonia gas and carbon dioxide are preferable. Furthermore, the ammonia gas and carbon dioxide added to the aqueous solutions may easily be treated using a deaerating apparatus or decarbonating apparatus, and this is advantageous in that an ion-exchanging apparatus, a reverse osmosis apparatus, a deaerating apparatus, or a combination of these, are not required.

Embodiment 1

FIG. 1 shows a room temperature wet cleaning apparatus which is capable of carrying out four processes and a drying process; the cleaning conditions are as given below.

First process: immersion and cleaning for 10 minutes in ozonated ultrapure water (with an ozone concentration of 5 mg/L, and pH of 4.0) at a flow rate of 1.5 L/min.

Second process: cleaning for 10 minutes in a solution in which 1 ppm of ammonia (pH 9.3) is added to hydrogenated ultrapure water (having a hydrogen concentration of 1.6 mg/L and a dissolved oxygen amount of 2 μg per liter) at a flow rate of 1.5 L/min, with the application of ultrasound (950 kHz, 240 W).

Third process: cleaning for 10 minutes in hydrofluoric acid/hydrogen peroxide/ultrapure water (0.5 wt %/0.5 wt %/99 wt %) with the application of ultrasound (950 kHz, 240 W).

Fourth process: cleaning for 10 minutes in hydrogenated ultrapure water (with a hydrogen concentration of 1.6 mg/L and a dissolved oxygen amount of 2 μg/L) at a flow rate of 1.5 L/min, with the application of ultrasound (950 kHz, 240 W).

In the ultrapure water employed in the second process and fourth process, the amount of oxygen gas dissolved was controlled using a deaeration membrane, the interior space of which was filled with hollow elements.

After 8-inch n-type (100) silicon substrates having a resistivity within a range of 8–12 Ω·cm were cleaned using the cleaning method of the present embodiment, the amounts of organic materials, metals, and microparticles present on the wafer surface, and the degree of flatness of the surface, were measured by, respectively, a Fourier transform type infrared spectrometer (produced by Bio-Rad Corporation), a total reflection fluorescent X-ray measuring apparatus (produced by Tekunosu Corporation), a wafer surface foreign matter detection apparatus (produced by KLA·Tencor Corporation) and an interatomic force microscope (produced by Seiko Instruments). The results thereof are shown in Table 1.

COMPARATIVE EXAMPLE 1

For the purposes of comparison, the organic materials, metals, and microparticles present on wafer surfaces and the flatness of the surfaces were measured in a manner identical to that of embodiment 1 after cleaning using conventional methods. The results thereof are shown in Table 1.

The cleaning conditions in these comparative examples were as shown below; and the mixing ratios of the chemicals and chemical solutions employed and the cleaning times are as given below.
1: Sulfuric acid/hydrogen peroxide cleaning
  120° C., 10 minutes
  Sulfuric acid (97 wt %): hydrogen peroxide (30 wt %)=4:1
2: Ultrapure water rinse
  25° C., 10 minutes
3: Dilute hydrofluoric acid cleaning
  25° C., 1 minute
  Hydrofluoric acid concentration: 0.5 wt %
4: Ultrapure water rinse
  25° C., 10 minutes
5: Ammonia/hydrogen peroxide cleaning
  80° C., 10 minutes
  Ammonia (28 wt %): hydrogen peroxide (30 wt %): ultrapure water=1:1:5
6: Ultrapure water rinse
  25° C., 10 minutes
7: Hot ultrapure water rinse
  80° C., 10 minutes
8: Ultrapure water rinse
  25° C., 10 minutes
9: Hydrochloric acid/hydrogen peroxide cleaning
  80° C., 10 minutes
  Hydrochloric acid (37 wt %): hydrogen peroxide (30 wt %): ultrapure water=1:1:6
10: Ultrapure water rinse
  25° C., 10 minutes
11: Dilute hydrofluoric acid
  25° C., 1 minute
  Hydrofluoric acid concentration: 0.5 wt %
12: Final ultrapure water rinse
  25° C., 10 minutes
13: Drying

TABLE 1

| | Organic matter ($CH_2$ amount) (moles/cm$^2$) | Amount of metal (copper) (atoms/cm$^2$) | Amount of microparticles (>0.1 μm) | Surface roughness (Ra) (nm) |
|---|---|---|---|---|
| Embodiment 1 | *0 | *1 × 10$^9$ | 0–1 | 0.11 |
| Comparative Example 1 | 2.5 × 10$^{14}$ | 2 × 10$^{10}$ | 9 | 0.15 |

*Below the threshold of detection.

Embodiment 2

The ozone concentration of the ozonated ultrapure water of the first process was changed to, respectively, 1 mg/L, 2 mg/L, 3 mg/L, and 5 mg/L, and the other cleaning conditions were the same as in embodiment 1, and this cleaning method was conducted.

After conducting cleaning with the cleaning method of this embodiment, the amount of organic material on the wafer surface was assessed using a Fourier transform infrared spectrometer (produced by Bio-Rad Corporation). The results thereof are shown in Table 2.

TABLE 2

| Ozone concentration | 1 mg/L | 2 mg/L | 3 mg/L | 5 mg/L |
|---|---|---|---|---|
| Organic matter ($CH_2$ amount) (moles/cm$^2$) | 2 × 10$^{15}$ | *0 | *0 | *0 |

*Below the threshold of detection.

Embodiment 3

The hydrogen concentration in the hydrogenated ultrapure water of the second process was altered to, respectively, 0 mg/L, 0.2 mg/L, 0.5 mg/L, and 1.0 mg/L, and the other cleaning conditions were as in embodiment 1, and this cleaning method was thus carried out.

After cleaning 8-inch n-type (100) silicon substrates having a resistivity within a range of 8–12 Ω·cm using the method of the present embodiment, the number of microparticles on the surface of the wafers was assessed using a wafer surface foreign matter detection apparatus (produced by KLA·Tencor Corporation) The results thereof are shown in Table 3.

TABLE 3

| Hydrogen concentration | 0 mg/L | 0.2 mg/L | 0.5 mg/L | 1.0 mg/L |
|---|---|---|---|---|
| Amount of microparticles (>0.1 μm) | 100–150 | 30–50 | 0–1 | 0–1 |

Embodiment 4

The ammonia concentration in the second process was altered to, respectively, 0 mg/L (pH 6.5), 0.5 mg/L (pH 8.0), 1 mg/L (pH 9.3), and 50 mg/L (pH 10.5), and the other cleaning conditions were as in embodiment 1, and this cleaning method was carried out.

After cleaning 8-inch n-type (100) silicon substrates having a resistivity within a range of 8–12 Ω·cm using the method of the present embodiment, the number of microparticles on the surface of the wafers was assessed using a wafer surface foreign matter detection apparatus (produced by KLA·Tencor Corporation) The results thereof are shown in Table 4.

TABLE 4

| pH | 6.3 | 8.0 | 9.0 | 10.5 |
|---|---|---|---|---|
| Amount of microparticles (>0.1 μm) | 200–250 | 180–220 | 0–1 | 0–1 |

Embodiment 5

The hydrofluoric acid concentration in the third process was altered to, respectively, 0.01 wt %, 0.05 wt %, 1.0 wt %, and 5.0 wt %, and the cleaning time was set to 5 minutes, and the other cleaning conditions were as in embodiment 1, and this cleaning method was carried out.

After cleaning 8-inch n-type (100) silicon wafers having a resistivity within a range of 8–12 Ω·cm using the method of the present embodiment, the amount of metal on the wafer surfaces, and the degree of flatness of the surfaces, were assessed using a total reflection fluorescent X-ray measuring apparatus (produced by Tekunosu Corporation), and an interatomic force microscope (produced by Seiko Instruments Corporation). The results thereof are shown in Table 5.

TABLE 5

| Hydrofluoric acid concentration | 0.01 wt % | 0.05 wt % | 1.0 wt % | 5.0 wt % |
|---|---|---|---|---|
| Amount of metal (copper) (atoms/cm$^2$) | 7 × 10$^9$ | *1 × 10$^9$ | *1 × 10$^9$ | *1 × 10$^9$ |
| Surface roughness (Ra) (nm) | 0.11 | 0.11 | 0.11 | 0.23 |

*Below the threshold of detection.

Embodiment 6

The hydrogen peroxide concentration in the third process was altered to, respectively, 0.05 wt %, 0.1 wt %, 1.0 wt %, and 5.0 wt %, and the cleaning time was set to 5 minutes, while the other cleaning conditions were as in embodiment 1, and this cleaning method was carried out.

After cleaning 8-inch n-type (100) silicon substrates having a resistivity within a range of 8–12 Ω·cm using the cleaning method of the present embodiment, the amount of metal and the thickness of the natural oxide film on the surface of the wafers were assessed using an X-ray photoelectric spectrometer (produced by Scienta Corporation). The results thereof are shown in Table 6.

TABLE 6

| Hydrogen peroxide concentration | 0.05 wt % | 0.1 wt % | 1.0 wt % | 5.0 wt % |
|---|---|---|---|---|
| Amount of metal (copper) (atoms/cm$^2$) | 1 × 10$^{10}$ | 1 × 10$^9$ | 1 × 10$^9$ | 1 × 10$^9$ |
| Oxide film thickness (Å) | *0 | *0 | *0 | 1.1 |

*Below the threshold of detection.

Embodiment 7

The hydrogen concentration in the hydrogenated ultrapure water of the fourth process was altered to, respectively, 0 mg/L, 0.2 mg/L, 0.5 mg/L, and 1.0 mg/L, and the other cleaning conditions were as in embodiment 1, and this cleaning method was carried out.

After cleaning 8-inch n-type (100) silicon wafers having a resistivity within a range of 8–12 Ω·cm using the cleaning method of the present embodiment, the number of microparticles on the surface of the wafers was assessed using a wafer surface foreign matter detecting apparatus (produced by KLA·Dencor Corporation). The results thereof are shown in Table 7.

TABLE 7

| Hydrogen concentration | 0 mg/L | 0.2 mg/L | 0.5 mg/L | 1.0 mg/L |
|---|---|---|---|---|
| Amount of microparticles (>0.1 μm) | 40–50 | 10–20 | 0–1 | 0–1 |

Embodiment 8

The concentration of dissolved oxygen in the hydrogenated ultrapure water of the fourth process was altered to, respectively, 2 μg/L, 10 μg/L, 100 μg/L and 500 μg/L, and the other cleaning conditions were as in embodiment 1, and this cleaning method was carried out.

After cleaning 8-inch n-type (100) silicon wafers having a resistivity within a range of 8–12 Ω·cm using the cleaning method of the present embodiment, the thickness of the natural oxide film was analyzed using an X-ray photoelectric spectrometer (produced by Scienta Corporation). The results thereof are shown in Table 8.

TABLE 8

| Oxygen concentration | 2 µg/L | 10 µg/L | 100 µg/L | 500 µ/L |
|---|---|---|---|---|
| Oxide film thickness (Å) | *0 | *0 | *0 | 0.8 |

*Below the threshold of detection.

Embodiment 9

8-inch n-type (100) silicon substrates having a resistivity within a range of 8–12 Ω·cm were cleaned at a temperature of 120° C. and for a period of 10 minutes in a chemical solution consisting of a 4:1 volumetric ratio mixture of 97 wt % sulfuric acid and 30 wt % hydrogen peroxide, and after rinsing with ultrapure water, these were treated for one minute in 0.5 wt % hydrofluoric acid. After this, the substrates were rinsed for a period of 10 minutes with ultrapure water. Next, after immersing these substrates in an aqueous solution of copper chloride, they were dried, and thereby, copper-contaminated substrates were produced. After assessing, using a total reflection fluorescent X-ray measuring apparatus (produced by Tekunosu Corporation), the copper concentration and the chlorine concentration on the copper-contaminated substrate surfaces prior to cleaning treatment, it was found that the copper concentration was $2.5 \times 10^{14}$ atoms/cm$^2$, and the chlorine concentration was $8.5 \times 10^{12}$ atoms/cm$^2$.

Using the apparatus of FIG. 1, the copper-contaminated substrates were cleaned for a period of 16 seconds while rotating at 1000 revolutions per minute using ozonated water, in which the dissolved ozone concentration in ultrapure water was set to 5 mg/L and the pH was set to 4.0 using carbon dioxide. Next, drying was conducted while rotating at 1500 revolutions per minute, and the copper concentration and the chlorine concentration on the surface of the copper-contaminated substrates after the cleaning treatment was assessed using a total reflection fluorescent X-ray measuring apparatus (produced by Tekunosu Corporation).

COMPARATIVE EXAMPLE 2

As a comparative example, using the apparatus of FIG. 1, copper-contaminated substrates were cleaned for a period of 16 seconds while rotating at 1000 revolutions per minute using ozonated water, in which the dissolved ozone concentration in the ultrapure water was set to 5 mg/L, and the pH was set to 5.1 using carbon dioxide. Next, drying was conducted while rotating at 1500 revolutions per minute, and the copper concentration and chlorine concentration on the surface of the copper-contaminated substrates after the cleaning treatment was assessed using a total reflection fluorescent X-ray measuring apparatus (produced by Tekunosu Corporation).

COMPARATIVE EXAMPLE 3

As a comparative example, using the apparatus of FIG. 1, the copper-contaminated substrates were cleaned for a period of 16 seconds while rotating at 1000 revolutions per minute using ozonated water, in which the concentration of dissolved ozone was set to 5 mg/L in the ultrapure water, after setting the pH to 4.0 by adding a hydrochloric acid solution. Next, drying was conducted while rotating at 1500 revolutions per minute, and the copper concentration and chlorine concentration on the surface of the copper-contaminated substrates after cleaning treatment was assessed using a total reflection fluorescent X-ray measuring apparatus (produced by Tekunosu Corporation).

COMPARATIVE EXAMPLE 4

As a comparative example, using the apparatus of FIG. 1, the copper-contaminated substrates were cleaned for a period of 16 seconds while rotating at 1000 revolutions per minute using ozonated water, in which the concentration of dissolved ozone was set to 5 mg/L in the ultrapure water, after setting the pH to 5.1 by adding a hydrochloric acid solution. Next, drying was conducted while rotating at 1500 revolutions per minute, and the copper concentration and chlorine concentration on the surface of the copper-contaminated substrates after cleaning treatment was assessed using a total reflection fluorescent X-ray measuring apparatus (produced by Tekunosu Corporation).

COMPARATIVE EXAMPLE 5

As a comparative example, using the apparatus of FIG. 1, the copper-contaminated substrates were cleaned for a period of 20 seconds while rotating at 1000 revolutions per minute using ozonated water, in which the concentration of dissolved ozone was set to 5 mg/L in the ultrapure water. Next, drying was conducted while rotating at 1500 revolutions per minute, and the copper concentration and chlorine concentration on the surface of the copper-contaminated substrates after cleaning treatment was assessed using a total reflection fluorescent X-ray measuring apparatus (produced by Tekunosu Corporation).

The results of Embodiment 2 and Comparative Examples 3 through 6 are shown in Table 9.

TABLE 9

|  | Copper concentration (atoms/cm$^2$) | Copper removal ratio (%) | Chlorine concentration (atoms/cm$^2$) |
|---|---|---|---|
| Contaminated wafer | $2.5 \times 10^{14}$ | — | $8.5 \times 10^{12}$ |
| Embodiment 9 | $8.4 \times 10^{11}$ | 99.6 | *Below the threshold of detection. |
| Comparative Example 2 | $1.5 \times 10^{12}$ | 99.4 | *Below the threshold of detection. |
| Comparative Example 3 | $9.1 \times 10^{11}$ | 99.6 | $4.6 \times 10^{13}$ |
| Comparative Example 4 | $1.5 \times 10^{12}$ | 99.4 | $3.2 \times 10^{13}$ |
| Comparative Example 5 | $1.8 \times 10^{13}$ | 92.4 | $4.3 \times 10^{11}$ |

*Below the threshold of detection (copper): $1.8 \times 10^9$ atoms/cm$^2$
*Below the threshold of detection (chlorine): $4.0 \times 10^{10}$ atoms/cm$^2$ It can be seen from the results of Table 9 that in embodiment 9, which employed ozonated water with a pH of 4.0 in which carbon dioxide was dissolved via a gas-permeable membrane, and in comparative example 3, which employed ozonated water, the pH of which was set to 4.0 by adding hydrochloric acid, the copper on the surface of the substrates was removed to the same degree. On the other hand, with respect to the chlorine atoms, embodiment 9, which contained no chlorine, exhibited removal effects which were superior to those of comparative example 3. It can thus be seen that ozonated water having a pH which is set to 4.0 using carbon dioxide exhibits cleaning effects which are superior to those of ozonated water having a pH which is set to 4.0 using hydrochloric acid. In contrast to this, comparative examples 2 and 4, which employed ozonated water having a pH of 5.1, and comparative example 5, which employed ozonated water in which the pH was not controlled, exhibited insufficient removal of the copper on the surface of the substrates.

What is claimed is:

1. A cleaning method comprising the steps of:
   a first cleaning process for removing organic materials and/or metallic impurities deposited on a substrate body to be cleaned by means of an aqueous solution containing ozone;
   a second cleaning process for removing microparticles deposited on the substrate body while applying vibration of 500 kHz or more to an aqueous solution containing hydrogen;
   a third cleaning process for removing metallic impurities and/or silicon oxide films by means of an aqueous solution containing hydrofluoric acid and hydrogen peroxide; and
   a fourth cleaning process, in which vibration of 500 kHz or more is applied to an aqueous solution containing hydrogen gas for removal and prevention of redeposition of microparticles.

2. A cleaning method in accordance with claim 1, wherein said cleaning method is conducted at room temperature.

3. A cleaning method in accordance with claim 2, wherein said first cleaning process using an aqueous solution containing ozone employs an aqueous solution in which ozone is dissolved in one of pure water or ultrapure water to an ozone concentration of 2 mg/L or more, gases other than ozone are added, and the pH thereof is regulated so as to be between 4 and 5 inclusive.

4. A cleaning method in accordance with claim 2, wherein said second cleaning process using an aqueous solution containing hydrogen employs an aqueous solution in which hydrogen is dissolved in one of pure water or ultrapure water at a concentration of 1.2 mg/L or more, and has a concentration of gases other than hydrogen is so controlled as to be 0.1 mg/L or less.

5. A cleaning method in accordance with claim 2, wherein said second cleaning process using an aqueous solution containing hydrogen employs an aqueous solution to which gases other than hydrogen gas are added, the pH of which is so controlled as to be 9.0 or more.

6. A cleaning method in accordance with claim 2, wherein said third cleaning process containing hydrofluoric acid and hydrogen peroxide employs an aqueous solution in which the concentration of hydrofluoric acid is between 0.05 wt % and 1.0 wt % inclusive, and the concentration of hydrogen peroxide is between 0.1 wt % and 1.0 wt % inclusive.

7. A cleaning method in accordance with claim 1, wherein said first cleaning process using an aqueous solution containing ozone employs an aqueous solution in which ozone is dissolved in one of pure water or ultrapure water to an ozone concentration of 2 mg/L or more, gases other than ozone are added, and the pH thereof is regulated so as to be between 4 and 5 inclusive.

8. A cleaning method in accordance with claim 7, wherein said second cleaning process using an aqueous solution containing hydrogen employs an aqueous solution in which hydrogen is dissolved in one of pure water or ultrapure water at a concentration of 1.2 mg/L or more, and has a concentration of gases other than hydrogen is so controlled as to be 0.1 mg/L or less.

9. A cleaning method in accordance with claim 7, wherein said second cleaning process using an aqueous solution containing hydrogen employs an aqueous solution to which gases other than hydrogen gas are added, the pH of which is so controlled as to be 9.0 or more.

10. A cleaning method in accordance with claim 9, wherein said third cleaning process containing hydrofluoric acid and hydrogen peroxide employs an aqueous solution in which the concentration of hydrofluoric acid is between 0.05 wt % and 1.0 wt % inclusive, and the concentration of hydrogen peroxide is between 0.1 wt % and 1.0 wt % inclusive.

11. A cleaning method in accordance with claim 10, wherein the substrate body to be cleaned is a semiconductor substrate, a liquid crystal substrate, a magnetic substrate, or a superconducting substrate.

12. A cleaning method in accordance with claim 7, wherein said third cleaning process containing hydrofluoric acid and hydrogen peroxide employs an aqueous solution in which the concentration of hydrofluoric acid is between 0.05 wt % and 1.0 wt % inclusive, and the concentration of hydrogen peroxide is between 0.1 wt % and 1.0 wt % inclusive.

13. A cleaning method in accordance with claim 1, wherein said second cleaning process using an aqueous solution containing hydrogen employs an aqueous solution in which hydrogen is dissolved in one of pure water or ultrapure water at a concentration of 1.2 mg/L or more, and has a concentration of gases other than hydrogen controlled as to be 0.1 mg/L or less.

14. A cleaning method in accordance with claim 13, wherein said second cleaning process using an aqueous solution containing hydrogen employs an aqueous solution to which gases other than hydrogen gas are added, the pH of which is so controlled as to be 9.0 or more.

15. A cleaning method in accordance with claim 1, wherein said second cleaning process using an aqueous solution containing hydrogen employs an aqueous solution to which gases other than hydrogen gas are added, the pH of which is so controlled as to be 9.0 or more.

16. A cleaning method in accordance with claim 1, wherein said third cleaning process containing hydrofluoric acid and hydrogen peroxide employs an aqueous solution in which the concentration of hydrofluoric acid is between 0.05 wt % and 1.0 wt % inclusive, and the concentration of hydrogen peroxide is between 0.1 wt % and 1.0 wt % inclusive.

17. A cleaning method in accordance with claim 1, wherein the substrate body to be cleaned is a semiconductor substrate, a liquid crystal substrate, a magnetic substrate, or a superconducting substrate.

* * * * *